(12) United States Patent
Negishi et al.

(10) Patent No.: US 9,076,780 B2
(45) Date of Patent: Jul. 7, 2015

(54) POWER MODULE AND LEAD FRAME FOR POWER MODULE

(75) Inventors: Yoshinori Negishi, Hitachi (JP); Hiroshi Nakano, Naka-gun (JP); Eiichi Ide, Hitachi (JP); Haruo Akahoshi, Hitachi (JP); Motoko Harada, Hitachi (JP); Toshiaki Ishii, Hitachi (JP)

(73) Assignee: HITACHI, LTD., Tokyo (JP)

( * ) Notice: Subject to any disclaimer, the term of this patent is extended or adjusted under 35 U.S.C. 154(b) by 62 days.

(21) Appl. No.: 13/994,417

(22) PCT Filed: Dec. 13, 2011

(86) PCT No.: PCT/JP2011/078770
§ 371 (c)(1),
(2), (4) Date: Jun. 14, 2013

(87) PCT Pub. No.: WO2012/086464
PCT Pub. Date: Jun. 28, 2012

(65) Prior Publication Data
US 2013/0270684 A1     Oct. 17, 2013

(30) Foreign Application Priority Data
Dec. 20, 2010     (JP) ................................ 2010-283092

(51) Int. Cl.
*H01L 23/482* (2006.01)
*H01L 23/495* (2006.01)
(Continued)

(52) U.S. Cl.
CPC .......... *H01L 23/49568* (2013.01); *H01L 24/26* (2013.01); *H01L 24/27* (2013.01); *H01L 24/28* (2013.01); *H01L 23/373* (2013.01); *H01L 23/3731* (2013.01); *H01L 23/3735* (2013.01); *H01L 21/4803* (2013.01); *H01L 21/4807* (2013.01); *H01L 21/481* (2013.01); *H01L 21/4871* (2013.01); *H01L 21/4878* (2013.01); *H01L 21/4882* (2013.01); *H01L 21/565* (2013.01); *H01L 23/3107* (2013.01); *H01L 23/36* (2013.01); *H01L 23/4334* (2013.01); *H01L 23/49582* (2013.01); *H01L 2224/48245* (2013.01); *H01L 2224/73265* (2013.01); *H01L 24/48* (2013.01); *H01L 2224/32245* (2013.01);
(Continued)

(58) Field of Classification Search
None
See application file for complete search history.

(56) References Cited

U.S. PATENT DOCUMENTS

2003/0197285 A1* 10/2003 Strandberg et al. ........... 257/778
2004/0016635 A1*  1/2004 Ford et al. ................. 204/192.1
(Continued)

FOREIGN PATENT DOCUMENTS

JP          61-295692 A    12/1986
JP          04-291948 A    10/1992
(Continued)

*Primary Examiner* — Fei Fei Yeung Lopez
(74) *Attorney, Agent, or Firm* — Volpe and Koenig, P.C.

(57) ABSTRACT

The present invention aims at providing a power module and a lead frame for the power module which can enhance adhesion between a heat sink and an insulating resin sheet while maintaining heat radiation properties. The power module includes: the lead frame including a conductor plate formed from Cu or a Cu alloy, and an Al film formed at least on the other side, opposite to one side on which to mount a semiconductor device, of the conductor plate; the semiconductor device mounted on the one side of the conductor plate; a sealing resin which seals at least the semiconductor device and the conductor plate; and an insulating resin sheet adhered to the conductor plate through the Al film therebetween.

12 Claims, 5 Drawing Sheets

(51) Int. Cl.
  *H01L 23/00* (2006.01)
  *H01L 23/373* (2006.01)
  *H01L 21/48* (2006.01)
  *H01L 21/56* (2006.01)
  *H01L 23/36* (2006.01)
  *H01L 23/433* (2006.01)
  *H01L 23/31* (2006.01)

(52) U.S. Cl.
  CPC ............... *H01L 2224/48247* (2013.01); *H01L 2224/48472* (2013.01); *H01L 2924/13091* (2013.01); *H01L 2924/13055* (2013.01); *H01L 2924/1305* (2013.01)

(56) References Cited

U.S. PATENT DOCUMENTS

| 2006/0043568 A1* | 3/2006 | Abe et al. ............... 257/698 |
| 2006/0056213 A1* | 3/2006 | Lee et al. ............... 363/144 |
| 2006/0165978 A1* | 7/2006 | Ito et al. ............... 428/343 |

FOREIGN PATENT DOCUMENTS

| JP | 06-112390 A | 4/1994 |
| JP | 06-132460 A | 5/1994 |
| JP | 2008-101227 A | 5/2008 |
| JP | 2010-182831 A | 8/2010 |

* cited by examiner (a)

(b)

(a)

(b)

(a)

(b)

(a)

(b)

(c)

(d)

POWER MODULE AND LEAD FRAME FOR POWER MODULE

TECHNICAL FIELD

The present invention relates to a power module and a lead frame for the power module. More specifically, the invention relates to a power module and a lead frame for the power module which are provided with a function of radiating heat from a semiconductor device.

BACKGROUND ART

Conventionally, switching devices (for example MOS-FETs (Metal-Oxide Semiconductor Field-Effect Transistors) or IGBTs (Insulated Gate Bipolar Transistors)) are used in various technological fields. Power modules using such devices often adopt a resin sealing structure for the purposes of enhancing reliability of electronic parts and enhancing production properties of the module. In the power module of the resin sealing structure as just-mentioned, in order to enhance radiation of the heat generated from the switching device, the switching device and a die pad on which the switching device is mounted are covered with a resin, with a heat release layer on the back side of the die pad left exposed. In addition, the exposed back side and an external cooling module are put in surface contact with each other through an insulating resin sheet therebetween. This makes it possible to secure a heat release route for releasing the heat generated by the switching device inside the module to the exterior, thereby promising an enhanced cooling efficiency for the switching device.

In recent years, the quantities of heat generated by power modules have been increasing, as the power modules have been enhanced in the degree of multifunctionality, output, and mounting density. Where the above-mentioned resin sealing structure capable of securing a heat release route while maintaining reliability is adopted, however, the heat generated by the switching devices can be diffused through the heat release layer, and can be efficiently released to the cooling module through a wide area.

Patent Document 1 discloses a power module in which a heat spreader on which a semiconductor chip is mounted and a heat sink member are joined to each other through a resin sheet having a high thermal conductivity.

Besides, Patent Document 2 discloses a printed circuit metallic substrate in which an Al layer is formed at least on one side of a Cu clad invar plate, and an insulating layer is formed thereon, whereby adhesion strength between the Cu clad invar plate and the insulating layer is enhanced.
Patent Document 1
JP-2008-101227-A
Patent Document 2
JP-61-295692-A

DISCLOSURE OF INVENTION

Problem to be Solved by the Invention

However, the power module disclosed in Patent Document 1 has the following problem. From the viewpoint of heat radiation properties, Cu or a Cu alloy having high thermal conductivity is used for forming the heat spreader. This results in that the adhesive strength between the heat spreader and the insulating resin sheet is low, and peeling of the bonding layer would occur attendant on the heat cycle. Such peeling generates void between the heat spreader and the insulating resin sheet, leading to dielectric breakdown of the semiconductor chip due to concentration of an electric field.

On the other hand, in the printed circuit metallic substrate disclosed in Patent Document 2, the heat spreader is formed from Al, whereby adhesion between the insulating resin sheet and the heat spreader can be enhanced. However, there arises the problem of lowering in heat radiation characteristics, since Al is poorer than Cu in thermal conductivity. Furthermore, wettability of the solder used for joining to the semiconductor chip is lowered, so that mounting properties of the semiconductor chip would be lowered.

The present invention has been made in consideration of the above-mentioned problems. Accordingly, it is an object of the present invention to provide a power module and a lead frame for the power module which make it possible to enhance adhesion between a heat sink and an insulating resin sheet while maintaining heat radiation properties.

Means for Solving the Problem

In order to solve the above-mentioned problems, the power module and the lead frame for the power module according to the present invention adopt, for example, the configurations as set forth in the claims.

The present patent application includes a plurality of means for solving the above-mentioned problems. One example of the plurality of means resides in a power module including: a lead frame including a conductor plate formed from Cu or a Cu alloy, and an Al film formed at least on other side, opposite to one side on which to mount a semiconductor device, of the conductor plate; the semiconductor device mounted on the one side of the conductor plate; a sealing resin which seals at least the semiconductor device and the conductor plate; and an insulating resin sheet adhered to the conductor plate through the Al film therebetween. Another example of the plurality of means resides in a lead frame for a power module, including a conductor plate formed from Cu or a Cu alloy, and an Al film formed at least on other side, opposite to a side on which to mount a semiconductor device, of the conductor plate.

Effects of the Invention

As understood from the above description, according to the present invention, an Al film is formed on a specified heat radiation surface of a conductor plate. In other words, a lead frame is used which has an Al film on the side, opposite to the side on which to mount a semiconductor device, of a conductor plate. This makes it possible to enhance the adhesion between the heat radiation surface and the insulating resin sheet while maintaining heat radiation characteristics.

The other problems, configurations and effects than the above-mentioned will become clear from the following description of embodiments.

DESCRIPTION OF REFERENCE NUMERALS

Figure 1:
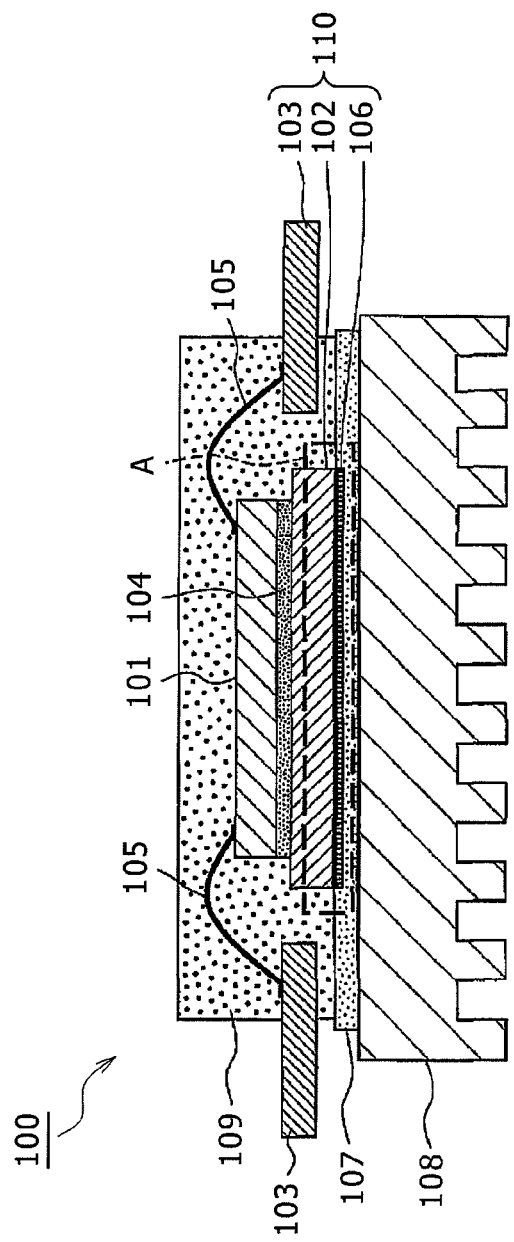
FIG. 1 is a schematic vertical sectional view of a power module according to the present invention.

100: Power module
101: Semiconductor device
102: Die pad (conductor plate)
103: Lead
104: Metallic bonding layer
105: Metallic wire (lead wire)
106: Al film
107: Insulating resin sheet
108: Cooling module
109, 301: Molding resin (sealing resin)
110: Lead frame
302: Lower mold for resin sealing
303: Upper mold for resin sealing

MODE FOR CARRYING OUT THE INVENTION

Now, embodiments of the power module and the lead frame for the power module according to the present invention will be described below, referring to the drawings.

FIG. 1 is a schematic vertical sectional view of a power module according to an embodiment of the present invention. An example of the power module according to this embodiment is a power module 100 using a lead frame 110, as shown in FIG. 1. Here, the lead frame 110 includes a die pad (conductor plate) 102 on which to mount a semiconductor device 101, leads 103 for input/output of electrical signals, and an Al film 106 formed on the side, opposite to the side on which to mount the semiconductor device 101, of the die pad 102. Incidentally, the lead frame 110 may, for example, be composed only of the die pad 102, on which to mount the semiconductor device 101, and the Al film 106, while omitting the leads 103. The semiconductor device 101 is joined to one side of the die pad 102 through a metallic bonding layer 104 therebetween, whereby the semiconductor 101 and the die pad 102 are electrically connected to each other. In addition, each of the leads 103 is disposed at a position spaced from the semiconductor device 101 and the die pad 102, and is electrically connected to the semiconductor device 101 through a metallic wire (lead wire) 105 by ultrasonic bonding, for example. Furthermore, the semiconductor device 101, the die pad 102, the leads 103, the metallic wires 105 and the like are sealed with a molding resin (sealing resin) 109 in such a manner that the leads 103 are partly exposed from the molding resin 109.

The Al film 106 is formed on the side (lower side), opposite to the side on which to mount the semiconductor device 101, of the die pad 102. The die pad 102 and an insulating resin sheet 107 are adhered to each other through the Al film 106 therebetween, and some parts of the molding resin 109 are also adhered to the insulating resin sheet 107. Besides, a cooling module 108 is provided on the lower side of the insulating resin sheet 107. Heat released from the semiconductor device 101 is transferred mainly to the metallic bonding layer 104, the die pad 102, and the Al film 106, and is then transferred through the insulating resin sheet 107, to be radiated through the cooling module 108. With the Al film 106 formed on the lower side of the die pad 102, adhesion between the insulating resin sheet 107 and the die pad 102 can be enhanced. In addition, with the thermal conductivity of the insulating resin sheet 107 being higher than the thermal conductivity of the molding resin 109, the heat generated by the semiconductor device 101 can be effectively transferred to the cooling module 108.

Here, the die pad 102 and the leads 103 of the lead frame 110 are formed from Cu or a Cu alloy having a high thermal conductivity. Besides, examples of the bonding material for forming the metallic bonding layer 104 include solder materials, low-temperature sintered bonding materials which contain fine metallic particles, and conductive adhesives which contain fine metallic particles. In addition, the metallic wires 105 are formed, for example, from Al, Au or the like. Furthermore, examples of the material usable as or for the molding resin 109 and the insulating resin sheet 107 include novolak, multifunctional, or biphenyl epoxy resin-based resins, and silicone resins. These resins may be admixed with ceramics such as $SiO_2$, $Al_2O_3$, AlN, BN, etc., gels, rubbers, or the like. It should be noted here, however, that the thermal conductivity of the insulating resin sheet 107 should be higher than the thermal conductivity of the molding resin 109, for ensuring effective transfer of the heat generated by the semiconductor device 101 to the cooling module 108. In addition, the cooling module 108 is formed from Cu, a Cu alloy, CuC, Cu—CuO or the like composite material, Al, an Al alloy, AlSiC, Al—C or the like composite material, or the like.

Figure 2:
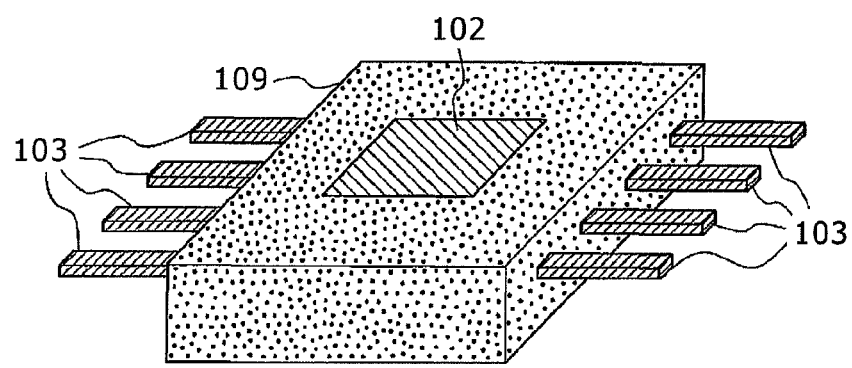
FIG. 2 (*a*) is a perspective view showing a back side of the power module after resin molding and before Al film formation, and FIG. 2 (*b*) is a perspective view showing the back side after the Al film formation, of the power module shown in FIG. 2 (*a*).
Figure 2:
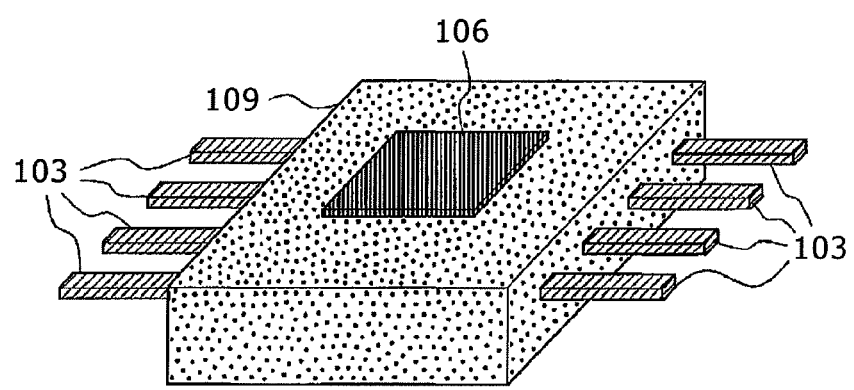

FIG. 2 shows perspective views showing the back side of the power module after molding of the molding resin 109, wherein FIG. 2 (a) is a perspective view showing the back side of the power module after resin molding and before Al film formation, and FIG. 2 (b) is a perspective view showing the back side after the Al film formation, of the power module shown in FIG. 2 (a).

As shown in FIG. 2 (a), the side on which the semiconductor device 101 is not mounted, of the die pad 102, is exposed from the molding resin 109 before the formation of the Al film 106. By applying a plating method or a sputtering method to the die pad 102 in such a state, the Al film 106 can be formed on a specified heat radiation surface on the die pad 102 which is exposed from the molding resin 109. After the Al film 106 is thus formed, the surface of the Al film 106 (the adhesion surface for adhesion to the insulating resin sheet 107) may be subjected to a physical roughening treatment such as sandblasting, etc., a roughening treatment by chemical etching conducted using an acid or an alkaline solution, chemical conversion, anodic oxidation, or the like. In addition, a process may be adopted in which the surface of the die pad 102 exposed from the molding resin 109 is subjected to a roughening treatment before the formation of the Al film 106, and thereafter the Al film 106 is formed on the roughened surface. Incidentally, after the Al film 106 is formed, the lead frame 110 shown in FIG. 1 is separated by cutting, whereby the functions as independent terminals are imparted.

After the Al film 106 is formed, as shown in FIG. 2 (b), the die pad 102 formed with the Al film 106 and the molding resin 109 are crimped to the cooling module 108 through the insulating resin sheet 107 therebetween. Here, the cooling module 108 may have a structure in which it makes contact with a cooling medium such as water or oil. Where such a structure is applied, the heat generated in the semiconductor device 101 upon electric conduction is transferred from the back side of the semiconductor device 101 to the metallic bonding layer 104, the die pad 102, and the Al film 106, and is transferred through the insulating resin sheet 107, to be radiated through the cooling module 108 more efficiently.

Figure 3:
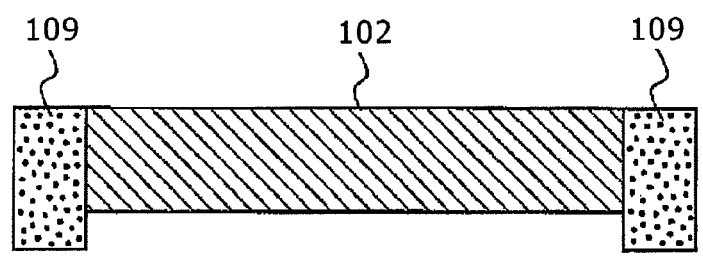
FIG. 3 (*a*) is an enlarged view of part A of FIG. 1, showing schematically an embodiment of the power module after resin molding and before Al film formation, and FIG. 3 (*b*) schematically shows the form after the Al film formation, of the power module shown in FIG. 3 (a).
Figure 3:
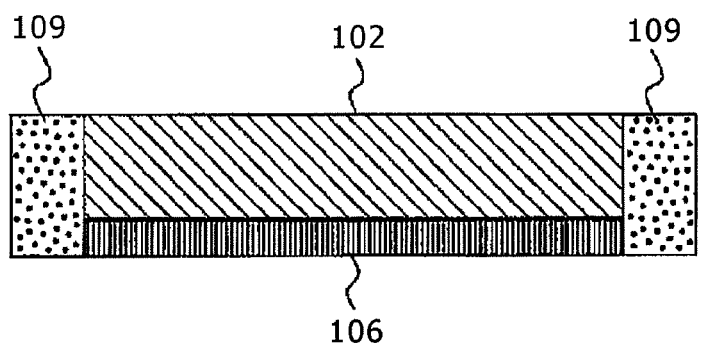
Figure 4:
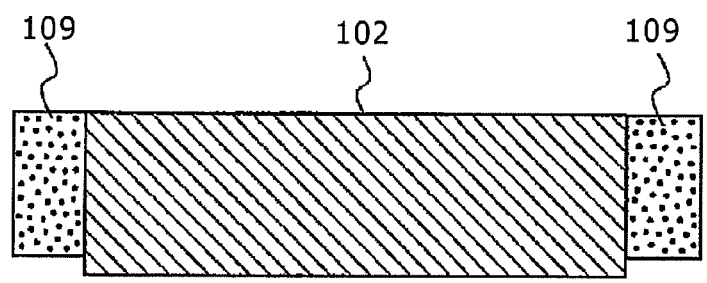
FIG. 4 (a) is an enlarged view of part A of FIG. 1, showing schematically another embodiment of the power module after resin molding and before Al film formation, and FIG. 4 (b) schematically shows the form after the Al film formation, of the power module shown in FIG. 4 (a).
Figure 4:
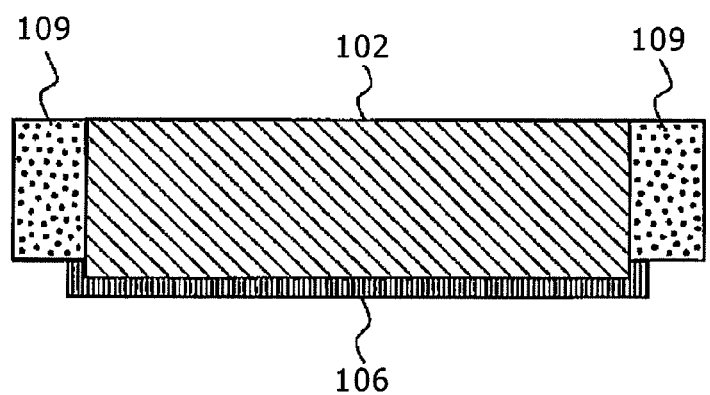

FIGS. 3 and 4 show enlarged views of part A, where the Al film 106 is formed, of the die pad 102 shown in FIG. 1. FIG. 3 (a) schematically shows the form of the power module after resin molding and before Al film formation, in the case where the bottom surface of the die pad 102 is recessed in relation to the bottom surface of the molding resin 109, whereas FIG. 3 (b) schematically shows the form of the power module after the Al film formation. FIG. 4 (a) schematically shows the form of the power module after resin molding and before Al film formation, in the case where the bottom surface of the die pad 102 is projected in relation to the bottom surface of the molding resin 109, whereas FIG. 4 (b) schematically shows the form of the power module after the Al film formation.

In the case of sealing the semiconductor device 101 and the die pad 102 and the like with the molding resin 109, it is preferable that the bottom surface of the molding resin 109 and the bottom surface of the die pad 102 are flush with each other. However, it is technically difficult to make the bottom surfaces perfectly flush with each other. In practice, therefore, the bottom surface of the die pad 102 may be recessed in relation to the bottom surface of the molding resin 109, as shown in FIG. 3 (a), or the bottom surface of the die pad 102 may be projected in relation to the bottom surface of the molding resin 109, as shown in FIG. 3 (b). As a method for forming the Al film 106, there may be used, for example, a plating method, a sputtering method, an Al film crimping method, or the like. Where a step is present between the molding resin 109 and the die pad 102 as above-mentioned, however, it is preferable to use the plating method or the sputtering method, by which the Al film 106 can be formed, without leaving any void at the interface between the Al film 106 and the die pad 102. Besides, where the Al film 106 is formed on the molding resin 109, the adhesion between the Al film 106 and the molding resin 109 is so weak that peeling may occur at the interface. As the method for forming the Al film 106, therefore, particularly preferred is the plating method, by which the Al film 106 can be formed on a specified surface on the die pad 102 and which promises excellent uniform coverage of a rugged substrate. In addition, when the height of the projected parts generated after formation of the Al film 106 is increased, a large step would be generated at the time of adhering the insulating resin sheet 107 thereto, which causes an increased internal stress, resulting in easy peeling of the insulating resin sheet 107. Therefore, the height of the projected parts is preferably not more than 10 μm.

The Al film 106 formed by the above-mentioned method ensures that in the case where the bottom surface of the die pad 102 is recessed in relation to the bottom surface of the molding resin 109 as shown in FIG. 3 (a), the Al film 106 can be formed only on the lower side of the die pad 102 as shown in FIG. 3 (b). Incidentally, by controlling the various conditions for the method of forming the Al film 106, it is possible to cause the surface of the Al film 106 formed to be flush with the bottom surface of the molding resin 109, as shown in the figure. In addition, in the case where the bottom surface of the die pad 102 is projected in relation to the bottom surface of the molding resin 109 as shown in FIG. 4 (a), the Al film 106 can be formed not only on the lower side of the die pad 102 but also on those parts of side surfaces of the die pad 102 which are projected from the molding resin 109. Thus, the Al film 106 can be formed on all the exposed heat radiation surfaces of the die pad 102, without leaving any void at the interface between the Al film 106 and the die pad 102. Consequently, heat radiation properties and adhesion can be enhanced more.

Now, a method of forming the Al film by Al electroplating will be described below, but the present invention is not to be restricted to or by the following description.

As an aluminum metal salt for use as an aluminum source, aluminum halides can be employed. Examples of the aluminum halides which can be used include anhydrous salts such as aluminum chloride, aluminum bromide, etc. When the concentration of aluminum in the plating solution is not more than an equimolar concentration relative to an organic compound for forming ion pairs with the aluminum metal salt, the deposition rate during plating would be conspicuously low. Therefore, a higher aluminum concentration leads to better uniformity of metal deposition during plating. Thus, the concentration of aluminum in the plating solution is not less than an equimolar concentration, preferably not less than 1.5 times, more preferably not less than 3 times, in relation to the concentration of the organic compound for forming ion pairs with the aluminum metal salt.

Here, examples of the organic compound for forming ion pairs with the aluminum metal salt include halides of organic compound cations of dialkylimidazolium salts, aliphatic phosphonium salts, quaternary ammonium salts, and the like. Examples of the compounds which can be preferably used as the dialkylimidazolium salts include 1,3-dialkylimidazolium halides such as 1-ethyl-3-methylimidazolium chloride ([EMIM].Cl), 1-ethyl-3-methylimidazolium bromide ([EMIM].Br), 1-ethyl-3-methylimidazolium iodide ([EMIM].I), 1-butyl-3-methylimidazolium chloride ([BMIM].Cl), 1-butyl-3-methylimidazolium bromide ([BMIM].Br), and 1-butyl-3-methylimidazolium iodide ([BMIM].I). Examples of the compounds which can be preferably used as the aliphatic phosphonium salts include ethyltributylphosphonium chloride ([EBP].Cl), ethyltributylphosphonium bromide ([EBP].Br), and ethyltributylphosphonium iodide ([EBP].I). Examples of the compounds which can be preferably used as the quaternary ammonium salts include tetraethylammonium bromide ([E4N].Br), trimethylethylammonium chloride ([M3EN].Cl), and tetrabutylammonium chloride ([Bu4N].Cl). Besides, taking workability into account, the plating temperature is preferably in the range of 10 to 60° C., more preferably 40° C. or below. Incidentally, when the plating temperature is lower than 10° C., the viscosity of the plating solution becomes high, and the plating film as a whole tends to be black.

Besides, the plating solution may be admixed with a nonpolar organic solvent. As the organic solvent, nonpolar solvents having a dielectric constant of not more than 8 are preferably used. When a polar organic solvent having a high dielectric constant is used, aluminum and the organic compound forming the ion pairs therewith are dissociated, leading to a lowering in the deposition efficiency in plating. The reason resides in that the Coulomb forces between positive and negative ions in an ionic liquid are inversely proportional to the dielectric constant of the medium; specifically, as the relative dielectric constant of the solvent is higher, the Coulomb forces are lowered, to make easier the dissociation of metal salts, leading to easier dissociation of the ion pairs formed between the aluminum metal salt and the organic compound. In view of this, the dielectric constant of the organic solvent is preferably not more than 8, more preferably not more than 5. Examples of such an organic solvent include hexane (dielectric constant: 2.0), toluene (dielectric constant: 2.4), diethyl ether (dielectric constant: 4.3), ethyl acetate (dielectric constant: 6.0), cyclohexane (dielectric constant: 2.0), xylene (dielectric constant: 2.5), benzene (dielectric constant: 2.3), naphthalene (dielectric constant: 2.5), heptane (dielectric constant: 1.9), cyclopentyl methyl ether (dielectric constant: 4.8), and dioxane (dielectric constant: 2.1), which may be used either singly or in combination of two or more of them. In addition, if the boiling point of the organic solvent is too low, the countermeasures needed against dissipation, inflammation or the like such as hermetic sealing, cooling, etc. would become excessively heavy. In view of this, the boiling point of the organic solvent is preferably not lower than 40° C. Besides, the volume fraction of the organic solvent based on the total amount of the ionic liquid and the organic solvent is preferably not less than 30 vol %, more preferably not less than 50 vol %, and further preferably not less than 75 vol %. If the volume fraction of the organic solvent is too high, however, the aluminum ion concentration would be too low, and when the volume fraction of the organic solvent exceeds 90 vol %, a lowering in current efficiency of plating would be caused. Therefore, the volume fraction of the organic solvent is preferably 90 vol %.

The aluminum (Al) electroplating is preferably conducted using a DC or pulsed current at a current density of 0.01 to 10 A/dm$^2$, for ensuring good current efficiency and uniform deposition of the plating metal. If the current density is too high, there would occur decomposition of the compounds, degradation of uniformity of the plating layer and, further, a lowering in current efficiency. Besides, the plating solution is instable to oxygen and moisture; therefore, the plating is desirably conducted in a dry inert gas atmosphere.

Now, the present invention will be described more in detail by showing Examples.

Examples 1 to 3

On a Cu foil having a thickness of 18 µm, an Al film was formed by electroplating. This operation was conducted in an argon dry box. A solution containing an imidazolium chloroaluminate was used as a plating solution. Specifically, 1-ethyl-3-methylimidazolium chloride ([EMIM]Cl, produced by Kanto Chemical Co., Ltd.) and anhydrous aluminum chloride ($AlCl_3$, produced by Wako Pure Chemical Industry, Ltd.) were weighed and mixed in a molar ratio [EMIM]Cl:$AlCl_3$ of 1:2, to prepare the electrolytic solution, and 100 ml of the electrolytic solution was placed in a 100 ml glass beaker. Next, an aluminum plate measuring 100 mm by 35 mm and 2 mm in thickness as an anode and a Cu foil measuring 100 mm by 35 mm and 18 µm in thickness as a cathode were placed in the beaker, oppositely to each other with a spacing of 30 mm therebetween, and immersed in the electrolytic solution. An insulating tape was applied to the Cu foil so as to restrict a plating area to 30 mm by 30 mm. The electrodes were connected to a power source through lead wires, and plating was carried out. Here, the plating was conducted using a constant-current power source at a current density of 10 mA/cm$^2$, for 1 minute in Example 1, 20 minutes in Example 2, and 60 minutes in Example 3, respectively. The plating was conducted at a voltage of not more than 1 V, and a plating solution temperature of 25° C. After the plating was over, each of the plated samples was washed with ethanol, taken out of the argon dry box, further washed with pure water, and dried in nitrogen gas, after which the thickness of the Al film was measured. The thickness of the Al film was 0.2 µm in Example 1, 4 µm in Example 2, and 10 µm in Example 3, respectively. The Al film of each plated sample and an insulating resin sheet having a thermal conductivity of 10 W/mK were put opposite to each other, and crimped to each other, to prepare a sample for evaluation of adhesion. Each of the samples thus obtained was evaluated for peel strength by a 90 degrees peeling test. In addition, samples prepared in the same manner as above were subjected to a PCT treatment for 12 hours, and the thus treated samples were served to measurement of peel strength. The results of peel strength measurement are set forth in Table 1 below, together with the results for Comparative Example 1. As understood from Table 1, all the samples obtained in Examples 1 to 3 showed a peel strength higher than that obtained in Comparative Example 1. Here, Example 2 with the Al film thickness of 4 µm gave the highest peel strength, both without PCT treatment and after PCT treatment for 12 hours. In Example 1 with the Al film thickness of 0.2 µm, the Al film had pits formed therein, the Cu foil was partly exposed, and, therefore, the peel strength was lower than that in Example 2. In Example 3 with the Al film thickness of 10 µm, the sample without PCT treatment gave a peel strength comparable to that in Example 2, but the sample subjected to the PCT treatment for 12 hours showed a considerable lowering in peel strength. This is because the increase in Al film thickness caused a step formed between the Cu foil and the Al film to be enlarged, leading to an increase in internal stress upon adhesion of the plated sample to the insulating resin sheet.

Comparative Example 1

A Cu foil with a thickness of 18 µm and an insulating resin sheet with a thermal conductivity of 10 W/mK were crimped to each other, to prepare a sample for evaluation of adhesion, and a peel strength test was conducted in the same manner as in Examples 1 to 3. The results of the test are set forth in Table 1.

Example 4

On a Cu foil measuring 100 mm by 35 mm and 18 µm in thickness, an Al film was formed by sputtering. Specifically, the Al film was formed by sputtering conducted using a DC magnetron sputtering apparatus and an Al target (75 mm in diameter, 3 mm in thickness) with a purity of 99.999%, in an argon atmosphere at a pressure of 0.5 Pa, a DC output of 4 W/cm$^2$, and a substrate temperature of 25° C. for 60 minutes. After the Al film formation, the sample was washed sequentially with ethanol and with pure water, and served to Al film measurement. The Al film was 4 µm thick. The Al film of the sputtered sample and an insulating resin sheet were placed opposite to each other, and crimped to each other, to prepare a sample for evaluation of adhesion. Then, a peel strength test was conducted in the same manner as in Examples 1 to 3. The test results are shown in Table 1. As seen from Table 1, the peel strength obtained in Example 4 was verified to be higher than that in Comparative Example 1. However, the peel strength was lower than that obtained in Example 2 with the same Al film thickness. The reason resides in that the Al film formed by sputtering had cracks formed therein, leading to a lowered film strength as compared with that in Example 2.

Example 5

In this Example 5, the process was carried out in the same manner as in Example 2, except that an Al film obtained by Al electroplating was subjected to a roughening treatment by chemical etching. Specifically, a plated sample obtained by Al plating at a current density of 10 mA/cm$^2$ for 20 minutes, followed by washing and drying, in the same manner as in Example 2, was subjected to etching of the Al film by immersion in an aqueous sodium hydroxide solution, to roughen the Al film. The thus roughened sample was washed with pure water, dried in nitrogen gas, and served to Al film measurement. A peel strength test was conducted in the same manner as in Example 2, the results being shown in Table 1. Example 5 gave a higher peel strength as compared with those in Comparative Example 1 and Example 2. This is attributable to an anchoring effect owing to ruggedness of the surface (adhesion surface for adhesion to the insulating resin sheet) of the Al film formed through the roughening treatment.

Example 6

In this Example 6, the process was carried out in the same manner as in Example 2, except that an Al film obtained by Al electroplating was then subjected to anodic oxidation. Specifically, a plated sample obtained by Al plating at a current density of 10 mA/cm$^2$ for 20 minutes, followed by washing and drying, in the same manner as in Example 2, was immersed in an aqueous 1 mol/L solution of sulfuric acid, and anodic oxidation of the Al film was conducted at a voltage of 20 V for 5 minutes. The anodized sample was washed with pure water, dried in nitrogen gas, and served to Al film measurement. A peel strength test was conducted in the same manner as in Example 2, the results being shown in Table 1. Example 6 gave a higher peel strength as compared with those in Comparative Example 1 and Example 2. This is attributable to an anchoring effect owing to formation of a porous Al$_2$O$_3$ layer having a thickness of 3 μm and a pore diameter of 20 nm, and to enhanced affinity for the insulating resin due to the formation of the oxide.

Example 7

In this Example 7, the process was carried out in the same manner as in Example 2, except that an Al film obtained by Al electroplating was subjected to chemical conversion. Specifically, a plated sample obtained by Al plating at a current density of 10 mA/cm$^2$ for 20 minutes, followed by washing and drying, in the same manner as in Example 2, was immersed in pure water at 100° C. for two hours, to perform chemical conversion of the Al film. The thus treated sample was washed with pure water, dried in nitrogen gas, and served to Al film measurement. A peel strength test was conducted in the same manner as in Example 2, the results being shown in Table 1. Example 7 gave a higher peel strength as compared with those in Comparative Example 1 and Example 2, but the peel strength is lower than those obtained in Examples 5 and 6. This is because the above-mentioned anchoring effect could not be obtained, though the formation of the oxide offered affinity for the insulating resin.

Example 8

In this Example 8, the procedure was carried out in the same manner as in Example 2, except that a Cu foil was subjected to a roughening treatment by chemical etching prior to Al electroplating. Specifically, the Cu foil was immersed in a mixed aqueous solution of ammonia and hydrogen peroxide, and was roughened by etching. Then, the roughened Cu foil was washed with pure water, and dried in nitrogen gas, after which it was subjected to Al electroplating in the same manner as in Example 2. The Al-plated sample was subjected to washing and drying, and then served to Al film measurement. A peel strength test was conducted in the same manner as in Example 2, the results being shown in Table 1. The peel strength obtained in Example 8 was higher than that obtained in Comparative Example 1, and was comparable to that in Example 2.

TABLE 1

|  | Al film thickness (μm) | Al film, formed by | Additional treatment | Peel strength (kN/m) Without PCT | Peel strength (kN/m) After 12 hours of PCT |
|---|---|---|---|---|---|
| Example 1 | 0.2 | plating | — | 0.60 | 0.28 |
| Example 2 | 4 | plating | — | 0.65 | 0.35 |
| Example 3 | 10 | plating | — | 0.64 | 0.20 |
| Example 4 | 4 | sputtering | — | 0.51 | 0.25 |
| Example 5 | 4 | plating | Al roughening | 1.2 | 0.86 |
| Example 6 | 4 | plating | Al anodic oxidation | 1.4 | 0.92 |
| Example 7 | 4 | plating | Al chemical conversion | 0.92 | 0.61 |
| Example 8 | 4 | plating | Cu roughening | 0.65 | 0.34 |
| Comparative Example 1 | — | — | — | 0.34 | 0.09 |

Examples 9 to 11

In each of Examples 9 to 11, an Al film 106 was formed by electroplating on a die pad 102 of a power module 100 shown in FIG. 1. Here, the power module 100 was polished so that the step between the bottom surface of the molding resin 109 and the bottom surface of the die pad 102 was reduced to or below 20 nm, followed by plating to form the Al film, prior to use for this investigation. The plating conditions were the same as in Examples 1 to 3. Specifically, a plating solution having a molar ratio of [EMIM]Cl:AlCl$_3$ of 1:2 was used, and the plating was conducted at a current density of 10 mA/cm$^2$, for 1 minute in Example 9, 20 minutes in Example 10, and 60 minutes in Example 11, respectively. As a result, the Al film was formed in a thickness of 0.2 μm, 4 μm, and 10 μm, respectively, in Examples 9, 10, and 11. The plating current was passed by use of the leads 103. Thereafter, the power module with the Al film thereon was crimped to an insulating resin sheet having a thermal conductivity of 10 W/mK, and subjected to a PCT treatment for 12 hours, after which a section was observed for examining the presence/absence of peeling of the insulating resin sheet. The results are set forth in Table 2 below. In Example 10 with the Al film thickness of 4 μm, no peeling was recognized, and a good adhesion state was confirmed, upon observation of the section. In Example 9 with the Al film thickness of 0.2 μm and Example 11 with the Al film thickness of 10 μm, small cracks were observed, though the adhesion state was generally good.

Comparative Example 2

In Comparative Example 2, a die pad 102 of a power module 100 shown in FIG. 1 and an insulating resin sheet with a thermal conductivity of 10 W/mK were crimped directly to each other. After a PCT treatment for 12 hours, the presence/absence of peeling of the insulating resin sheet was examined by observation of a section. The power module 100 was polished so that the step between the molding resin 109 and the bottom surface of the die pad 102 was reduced to or below 20 nm, prior to use for this investigation. The result is shown in Table 2. In Comparative Example 2, large peeling was recognized, showing defective adhesion between the die pad and the insulating resin sheet, upon section observation.

Example 12

In Example 12, an Al film 106 was formed by sputtering on a die pad 102 of a power module 100 shown in FIG. 1. The power module 100 was polished so that the step between the bottom surface of the molding resin 109 and the bottom surface of the die pad 102 was reduced to or below 20 nm, followed by sputtering to form the Al film 106, prior to use for this investigation. The sputtering conditions were the same as in Example 4, except that other parts than the die pad 102 were covered by use of a glass mask. After the Al film was formed in a thickness of 4 μm by sputtering, the power module with the Al film thereon was crimped to an insulating resin sheet having a thermal conductivity of 10 W/mK. After a PCT treatment for 12 hours, the presence/absence of peeling of the insulating resin sheet was examined by observation of a section, the result being shown in Table 2. In Example 12, the adhesion state was generally good, but small cracks were observed, like in Examples 9 and 11.

Example 13

In this Example 13, the procedure was carried out in the same manner as in Example 10, except that an Al film obtained by Al electroplating was subjected to a roughening treatment by chemical etching. The power module 100 was polished so that the step between the bottom surface of the molding resin 109 and the bottom surface of the die pad 102 was reduced to or below 20 nm, followed by plating to form the Al film, prior to use for this investigation. Specifically, a plated sample obtained by Al plating, followed by washing and drying, in the same manner as in Example 10, was immersed in an aqueous sodium hydroxide solution to etch the Al film, thereby roughening the Al film. The thus treated sample was then washed with pure water, dried in nitrogen gas, and served to Al film measurement. The sample with the roughened Al film thereon was crimped to an insulating resin sheet having a thermal conductivity of 10 W/mK. After a PCT treatment for 12 hours, the presence/absence of peeling of the insulating resin sheet was examined by observation of a section, the result being shown in Table 2. In Example 13, no peeling was recognized, and the adhesion state was found good, upon section observation.

Example 14

In this Example 14, the process was carried out in the same manner as in Example 10, except that an Al film obtained by Al electroplating was subjected to anodic oxidation. The power module 100 was polished so that the step between the bottom surface of the molding resin 109 and the bottom surface of the die pad 102 was reduced to or below 20 nm, followed by plating to form the Al film, prior to use for this investigation. Specifically, a plated sample obtained by Al plating, followed by washing and drying, in the same manner as in Example 10, was immersed in an aqueous 1 mol/L solution of sulfuric acid, and anodic oxidation of the Al film was conducted at a voltage of 20 V for 5 minutes. The thus anodized sample was washed with pure water, dried in nitrogen gas, and served to Al film measurement. The sample with the anodized Al film thereon was crimped to an insulating resin sheet having a thermal conductivity of 10 W/mK. After a PCT treatment for 12 hours, the presence/absence of peeling of the insulating resin sheet was examined by observation of a section, the result being shown in Table 2. In Example 14, no peeling was recognized, and the adhesion state was found good, upon section observation.

Example 15

In this Example 15, the process was carried out in the same manner as in Example 10, except that an Al film obtained by Al electroplating was subjected to chemical conversion. The power module 100 was polished so that the step between the bottom surface of the molding resin 109 and the bottom surface of the die pad 102 was reduced to or below 20 nm, followed by plating to form the Al film, prior to use for this investigation. Specifically, a plated sample obtained by Al plating, followed by washing and drying, in the same manner as in Example 10, was immersed in pure water at 100° C. for two hours, to perform chemical conversion of the Al film. The thus treated sample was washed with pure water, dried in nitrogen gas, and served to Al film measurement. The sample with the chemical conversion treated Al film thereon was crimped to an insulating resin sheet having a thermal conductivity of 10 W/mK. After a PCT treatment for 12 hours, the presence/absence of peeling of the insulating sheet was examined by observation of a section, the result being shown in Table 2. In Example 15, no peeling was recognized, and the adhesion state was found good, upon section observation.

Example 16

In this Example 16, the process was carried out in the same manner as in Example 10, except that a die pad, before subjected to Al electroplating, was subjected to a roughening treatment by chemical etching. Incidentally, the power module 100 was polished so that the step between the bottom surface of the molding resin 109 and the bottom surface of the die pad 102 was reduced to or below 20 nm, followed by formation of the Al film, prior to use for this investigation. Specifically, the die pad 102 was immersed in an aqueous mixed solution of ammonia and hydrogen peroxide to etch the die pad, thereby roughening the die pad. The thus roughened die pad was washed with pure water and dried in nitrogen gas, after which the Al plating was conducted in the same manner as in Example 10. The sample obtained upon the Al plating, followed by washing and drying, was served to Al film measurement. The sample with the Al film thereon was crimped to an insulating resin sheet having a thermal conductivity of 10 W/mK. After a PCT treatment for 12 hours, the presence/absence of peeling of the insulating resin sheet was examined by observation of a section, the result being shown in Table 2. In Example 16, no peeling was recognized, and the adhesion state was found good, upon section observation.

TABLE 2

| | Al film thickness (μm) | Al film, formed by | Additional treatment | Adhesion state between Al film and insulating resin sheet |
| --- | --- | --- | --- | --- |
| Example 9 | 0.2 | plating | — | Δ |
| Example 10 | 4 | plating | — | ○ |
| Example 11 | 10 | plating | — | Δ |
| Example 12 | 4 | sputtering | — | Δ |
| Example 13 | 4 | plating | Al roughening | ○ |
| Example 14 | 4 | plating | Al anodic oxidation | ○ |
| Example 15 | 4 | plating | Al chemical conversion | ○ |
| Example 16 | 4 | plating | Cu roughening | ○ |
| Comparative Example 2 | — | — | — | x |

Example 17

This Example 17 pertains to a power module produced by use of a lead frame having an Al film 106 preliminarily formed on a die pad 102. The steps for producing such a power module will now be described, referring to FIG. 5.

Figure 5:
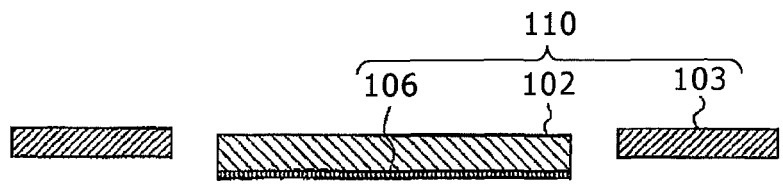
FIGS. 5 (a) to (d) are vertical sectional views schematically illustrating steps for manufacturing a power module using a lead frame after Al film formation.
Figure 5:
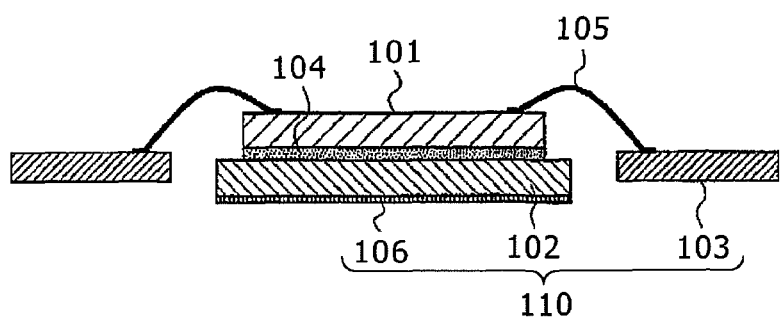
Figure 5:
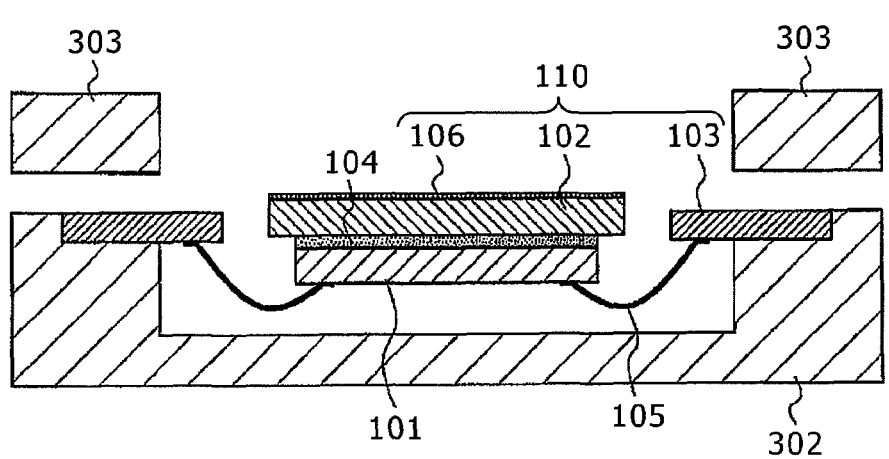
Figure 5:
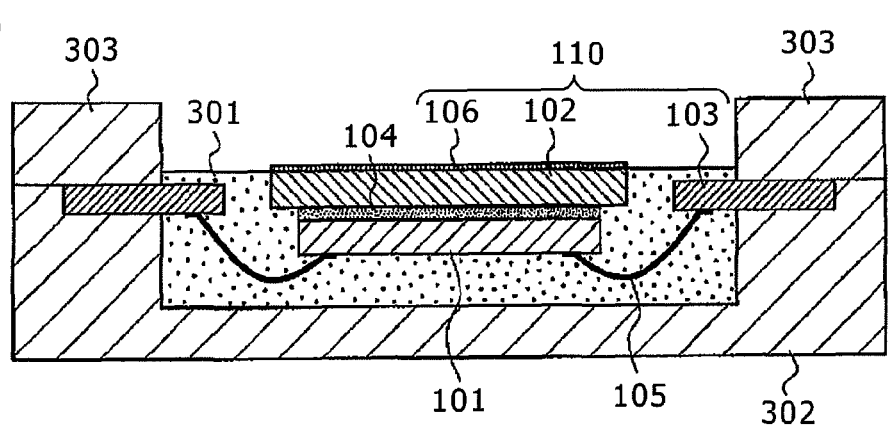

First, as shown in FIG. 5 (a), a lead frame 110 is prepared which includes the die pad 102, the Al film 106 preliminarily formed on one side of the die pad 102, and leads 103. Incidentally, the Al film 106 shown in the figure can be preliminarily formed in a desired area on the die pad 102 by conducting electroplating, sputtering or the like while covering the other areas than the desired area on the die pad 102 with an insulating tape. For example, using a plating solution having a ratio of [EMIM]Cl:AlCl$_3$ of 1:2 (molar ratio), electroplating is conducted at a plating solution temperature of 25° C. and a current density of 10 mA/cm$^2$ for 20 minutes, whereby the Al film 106 can be formed in a thickness of 4 μm on the die pad 102.

Next, as shown in FIG. 5 (b), a semiconductor device 101 is fixed onto the side (upper side), opposite to the side on which the Al film 106 is formed, on the die pad 102 through a metallic bonding layer 104 therebetween. Here, examples of a bonding material for forming the metallic bonding layer 104 include solder materials, low-temperature sintered bonding materials which contain fine metallic particles, and conductive adhesives which contain fine metallic particles. Thereafter, a metallic wire 105 is bonded to the semiconductor device 101 and each lead 103 by ultrasonic bonding. Incidentally, the metallic wires 105 are produced from Al, Au or the like.

Subsequently, as shown in FIG. 5 (c), molds 302 and 303 for resin sealing are prepared, and the lead frame 110 with the semiconductor device 101 and the like mounted thereon is disposed in a predetermined position on the resin sealing mold 302, in the state of having the semiconductor device 101 on the lower side thereof.

Then, as shown in FIG. 5 (d), the upper mold 303 is mounted and secured to the lower mold 302, and a molten molding resin 301 is loaded into the resin sealing mold. Here, the molten molding resin 301 is poured into the resin sealing mold while controlling the amount of the molding resin 301 poured, in such a manner as to prevent the molding resin 301 from making contact with the Al film 106. Then, the molding resin 301 is cured by heating or the like, whereby a power module can be produced in which the semiconductor device 101, the die pad 102, parts of the leads 103, the metallic wires 105, and the like are sealed with the resin. Examples of the molding resin 301 used here include novolak, multifunctional, or biphenyl epoxy resin-based resins, and silicone resins, which may be admixed with ceramic such as SiO$_2$, Al$_2$O$_3$, AlN, BN, etc., gel, rubber or the like.

A module fabricated by the production steps shown in FIG. 5 while using the lead frame 110 preliminarily formed with the Al film 106 was crimped to an insulating resin sheet having a thermal conductivity of 10 W/mK. After a PCT treatment, the presence/absence of peeling of the insulating resin sheet was examined by observation of a section. In Example 17, no peeling of the insulating sheet was recognized, and the adhesion state was found good, upon section observation.

It is to be noted that the present invention is not limited to the aforementioned embodiments, but covers various modifications. While, for illustrative purposes, those embodiments have been described specifically, the present invention is not necessarily limited to the specific forms disclosed. Thus, partial replacement is possible between the components of a certain embodiment and the components of another. Likewise, certain components can be added to or removed from the embodiments disclosed.

Further note that the control lines and information lines shown above represent only those lines necessary to illustrate the present invention, not necessarily representing all the lines required in terms of products. Thus, it can be assumed that almost all the components are in fact interconnected.

The invention claimed is:

1. A power module comprising:
    a lead frame including a conductor plate formed from Cu or a Cu alloy, and an Al film formed at least on other side, opposite to one side on which to mount a semiconductor device, of the conductor plate;
    the semiconductor device mounted on the one side of the conductor plate;
    a sealing resin which seals at least the semiconductor device and the conductor plate; and
    an insulating resin sheet adhered to the conductor plate through the Al film therebetween;
    wherein the lead frame of the power module further includes leads formed from Cu or a Cu alloy, the lead being located at a position spaced from the semiconductor device and the conductor plate, being connected to the semiconductor device through a lead wire, and being sealed with the sealing resin together with the lead wire in such a manner that the leads are partly exposed from the sealing resin.

2. The power module according to claim 1, wherein the other side of the conductor plate has undergone a roughening treatment.

3. The power module according to claim 1, wherein the Al film formed on the conductor plate has undergone a roughening treatment.

4. The power module according to claim 1, wherein the Al film formed on the conductor plate has undergone chemical conversion.

5. The power module according to claim 1, wherein the Al film formed on the conductor plate has undergone anodic oxidation.

6. The power module according to claim 1, wherein the sealing resin and the insulating resin sheet differ from each other in thermal conductivity.

7. The power module according to claim 1, wherein the insulating resin sheet has a thermal conductivity of not less than 3 W/mK.

8. The power module according to claim 1, wherein the Al film formed on the conductor plate has a thickness of 0.2 to 10 μm.

9. The power module according to claim 1, wherein the Al film is formed by a plating method.

10. The power module according to claim 1, wherein the Al film is formed by a sputtering method.

11. A lead frame for a power module, comprising a conductor plate formed from Cu or a Cu alloy, and an Al film formed at least on other side, opposite to a side on which to mount a semiconductor device, of the conductor plate; and
    the lead frame of the power module further includes leads formed from Cu or a Cu alloy, the lead being located at a position spaced from the semiconductor device and the conductor plate, being connected to the semiconductor device through a lead wire.

12. The lead frame for the power module according to claim 11, wherein the Al film is formed by a plating method.

* * * * *